(12) United States Patent
Knoedgen et al.

(10) Patent No.: US 9,568,508 B2
(45) Date of Patent: Feb. 14, 2017

(54) HIGHLY ACCURATE CURRENT MEASUREMENT

(71) Applicant: Dialog Semiconductor GmbH, Kirchheim/Teck-Nabern (DE)

(72) Inventors: Horst Knoedgen, Munich (DE); Frank Kronmueller, Neudenau (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 305 days.

(21) Appl. No.: 14/188,060

(22) Filed: Feb. 24, 2014

(65) Prior Publication Data
US 2015/0008902 A1 Jan. 8, 2015

(30) Foreign Application Priority Data
Jul. 5, 2013 (EP) .................... 13175250

(51) Int. Cl.
G01R 19/00 (2006.01)
H02M 1/00 (2006.01)
G01R 35/00 (2006.01)

(52) U.S. Cl.
CPC ......... *G01R 19/0092* (2013.01); *G01R 35/005* (2013.01); *H02M 2001/0009* (2013.01); *H03K 2217/0027* (2013.01)

(58) Field of Classification Search
CPC .............................. G05F 1/10; G01R 19/0092
See application file for complete search history.

(56) References Cited

U.S. PATENT DOCUMENTS

| 5,081,379 A * | 1/1992 | Korteling ......... G01R 19/16519 327/50 |
| 5,867,014 A | 2/1999 | Wrathall et al. |
| 2005/0194955 A1 * | 9/2005 | Moran ............. H01L 31/02019 323/315 |
| 2008/0130330 A1 | 6/2008 | Tao |
| 2010/0134086 A1 | 6/2010 | Theil et al. |

(Continued)

OTHER PUBLICATIONS

European Search Report 13175250.3-1560 Mailed: Dec. 11, 2013, Dialog Semiconductor GmbH.

*Primary Examiner* — Jermele M Hollington
*Assistant Examiner* — Feba Pothen
(74) *Attorney, Agent, or Firm* — Saile Ackerman LLC; Stephen B. Ackerman (57) ABSTRACT

The present document relates to the measurement of the current through a transistor. In particular, the present document relates to a circuit arrangement which allows an accurate measurement of the current through a power transistor. A circuit arrangement is described. The circuit arrangement is configured to provide an indication of a current flowing through a pass switch, when the pass switch is arranged in parallel to the circuit arrangement. The circuit arrangement comprises a matching unit which comprises a switch bank comprising a plurality of parallel reference switches; a resistor bank comprising a plurality of serial reference resistors; and a reference current source configured to provide a reference current flowing through the switch bank and the resistor bank. The resistor bank and the switch bank are arranged in series. The switch bank is adapted in accordance to a voltage dependent resistance of the pass switch, and the resistor bank is adapted in accordance to a voltage independent resistance of the pass switch.

19 Claims, 4 Drawing Sheets

(56) References Cited

U.S. PATENT DOCUMENTS

2011/0061038 A1\* 3/2011 Qiao .................. G06F 17/5077
716/126
2011/0068762 A1 3/2011 Nishida
2014/0049238 A1\* 2/2014 Hu ........................ G01R 19/00
323/282

\* cited by examiner

HIGHLY ACCURATE CURRENT MEASUREMENT

TECHNICAL FIELD

The present document relates to the measurement of the current through a transistor. In particular, the present document relates to a circuit arrangement which allows an accurate measurement of the current through a power transistor.

BACKGROUND

Power converters and in particular switched mode power converters typically make use of one or more power switches which are commutated between an on-state and an off-state in an alternating manner at a commutation cycle rate. The one or more power switches may be controlled in dependence of the current flowing through the one or more power switches. By way of example, a power switch may be commutated from an on-state to an off-state, subject to the detection that the current through the power switch has reached a pre-determined peak current.

In order to be able to accurately control the states of a power switch based on the current flowing through the power switch, current measurement means are desirable which are configured to provide an accurate indication of the current flowing through the power switch. This disclosure describes such current measurement means.

SUMMARY

According to an aspect, a circuit arrangement configured to provide an indication of a current flowing through a pass switch is described. The circuit arrangement is also referred to herein as current measurement means. The circuit arrangement may be configured to provide the indication of the current flowing through the pass switch, when the pass switch is arranged in parallel to the circuit arrangement. The indication of the current flowing through the pass switch may correspond to a voltage drop at an output of the circuit arrangement. The pass switch may comprise a power transistor, e.g. a field effect transistor (FET) such as a metal oxide semiconductor field effect transistor (MOSFET).

The circuit arrangement may comprise a matching unit which comprises a switch bank comprising a plurality of parallel reference switches. The reference switches may comprise transistors, such as FETs, MOSFETs. Furthermore, the matching unit may comprise a resistor bank comprising a plurality of serial reference resistors. The plurality of serial reference resistors may comprise or may be metal resistors, in order to mimic the behavior of the parasitic resistance (also referred to as the metal resistance) of the pass switch. In addition, the matching unit may comprise a reference current source configured to provide a reference current flowing through the switch bank and the resistor bank. The resistor bank, the switch bank and the reference current source may be arranged in series with respect to one another. The matching unit may be arranged in parallel to the pass switch.

The switch bank may be adapted in accordance to a voltage dependent resistance of the pass switch (e.g. in accordance to the on-resistance of the pass switch). In other words, the switch bank may have been configured based on the voltage dependent resistance of the pass switch (e.g. in the context of a calibration process). On the other hand, the resistor bank may be adapted in accordance to a voltage independent resistance of the pass switch (e.g. the metal resistance of the pass switch). In other words, the resistor bank may have been configured based on the voltage independent resistance of the pass switch (e.g. in the context of a calibration process). As such, the total resistance of the pass switch may be divided into a voltage dependent component (the voltage dependent resistance) and a voltage independent component (the voltage independent resistance). The circuit arrangement may comprise a switch bank to match the voltage dependent component and a resistor bank to match the voltage independent component of the total resistance of the pass switch.

Typically the "matching" is subject to a pre-determined scaling factor. The total resistance of the pass switch (also referred to as the pass device), which comprises the voltage independent resistance and the voltage dependent resistance of the pass switch, multiplied by the scaling factor may correspond to (e.g. may be equal to) a total resistance (comprising a voltage independent resistance and a voltage dependent resistance) of the matching unit. This may be the case for at least one particular value of a supply voltage applied across the pass switch (and applied across the matching unit which is arranged in parallel to the pass switch). The scaling factor may be 10, 100, 1000 or greater. By doing this, it can be ensured that the current flowing through the matching unit is substantially smaller than the current flowing through the pass switch, thereby reducing the losses incurred by the current measurement means.

The switch bank may comprise a first reference switch which is in an on-state, when the pass switch is in an on-state. The others (e.g. all others) of the plurality of reference switches of the switch bank may be in an off-state, when the pass switch is in an on-state. As such, the voltage dependent resistance of the pass switch may be matched using the first reference switch from the switch bank. In other words, only a single one of the plurality of reference switches of the switch bank may be used to match the voltage dependent resistance of the pass switch. The first reference switch may have been selected in the context of the calibration process.

A voltage dependent resistance of the first reference switch may approximate the voltage dependent resistance of the pass switch multiplied by the scaling factor for a plurality of different supply voltages which are applied across the pass switch. In other words, the voltage dependency of the first reference switch may approximate the voltage dependency of the pass switch.

In yet other words, a difference of the voltage dependent resistance of the first reference switch and the voltage dependent resistance of the pass switch, the latter being multiplied by the scaling factor, may be smaller than or equal to a pre-determined voltage threshold for the plurality of different supply voltages. In particular, the difference obtained using the first reference switch may be smaller (in average for the plurality of supply voltages) than the difference obtained using another one (e.g. any other one) of the plurality of reference switches of the switch bank. As such, the first reference switch may be the reference switch from the switch bank providing the best match of the voltage dependent resistance of the pass switch (for the plurality of different supply voltages, and/or when multiplied with the scaling factor).

The indication of the current flowing through the pass switch may be provided at an output of the resistor bank, e.g. as a voltage drop at an output of the resistor bank. The output of the resistor bank may correspond to a point at a beginning, in-between or at an end of the plurality of serial reference resistors, i.e. of the serial arrangement of resistors. As such, by changing the point used as an output of the resistor bank, the total resistance of the resistor bank may be modified. The point used as an output of the resistor bank may depend on the voltage independent resistance of the pass switch. The plurality of reference resistors of the resistor bank may be voltage independent, such that the reference resistors may be used to match the voltage independent resistance of the pass switch. In particular, a total resistance of the resistor bank at the output of the resistor bank may correspond to (e.g. may be equal to) the voltage independent resistance of the pass switch multiplied by the scaling factor.

The reference current provided by the reference current source may correspond to a current through the pass switch divided by the scaling factor.

The circuit arrangement may comprise a pre-adjustment resistor arranged in series with the switch bank and the resistor bank. The pre-adjustment resistor may comprise or may correspond to a voltage independent resistor. A total resistance of the resistor bank and the pre-adjustment resistor may correspond to (e.g. may be equal to) the voltage independent resistance of the pass switch multiplied by the scaling factor.

In particular, the circuit arrangement may comprise an ordered series of matching units. Furthermore, the circuit arrangement may comprise an ordered series of pre-adjustment resistors for the ordered series of matching units, respectively. A particular matching unit of the ordered series of matching units may be coupled to the supply voltage via its corresponding pre-adjustment resistor and via the pre-adjustment resistor corresponding to the matching unit preceding the particular matching unit in the ordered series of matching units. As such, a successively increasing pre-adjustment resistor may be used for the different matching units. In particular, the series of matching units and the series of pre-adjustment resistors may be used to match a larger range of voltage independent resistances of the pass switch.

The switch banks of the ordered series of matching units may comprise corresponding pluralities of reference switches. This may be beneficial during calibration, as corresponding ones of the pluralities of reference switches may be used to match the voltage dependent resistance of the pass switch.

According to a further aspect, a system comprising the pass switch, which is configured to commutate between an on-state and an off-state, is described. An example for such a system is a switched mode power converter. Furthermore, the system may comprise the circuit arrangement described in the present document, which is arranged in parallel to the pass switch and which is configured to provide an indication of the current flowing through a pass switch.

According to another aspect, a method for providing an indication of the current flowing through the pass switch is described. The method may comprise providing a switch bank comprising a plurality of parallel reference switches. Furthermore, the method may comprise providing a resistor bank comprising a plurality of serial reference resistors. In addition, the method may comprise providing a reference current source configured to provide a reference current flowing through the switch bank and through the resistor bank. The resistor bank and the switch bank may be arranged in series with respect to one another.

Furthermore, the resistor bank and the switch bank may be arranged in parallel to the pass switch. The switch bank may be adapted in accordance to a voltage dependent resistance of the pass switch and the resistor bank may be adapted in accordance to a voltage independent resistance of the pass switch. A total resistance of the pass switch corresponds to the sum of the voltage dependent resistance and the voltage independent resistance.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
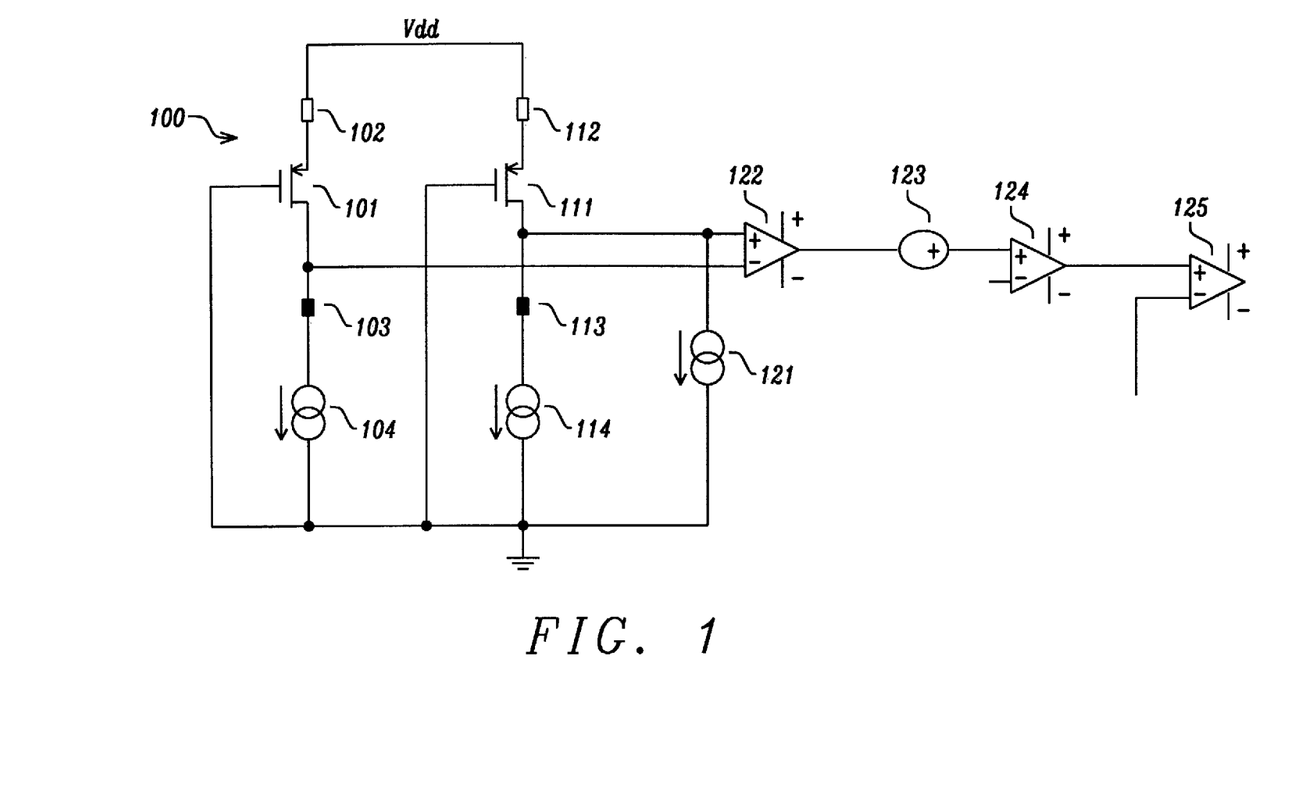
FIG. 1 shows a block diagram of an example test system for calibrating current measurement means configured to provide an indication of the current flowing through a pass power switch.

As indicated above, it is desirable to provide current measurement means which are configured to provide an accurate indication of the current flowing through a power switch, referred to herein as a pass switch. FIG. 1 shows a block diagram of an example test system 100 for calibrating the current measurement means. The current measurement means comprise a reference switch 111 and a reference resistor 112 which are designed in accordance to the pass switch 101, 102. The switches may be field effect transistors (FETs), e.g. metal oxide semiconductor FETs (MOSFETs).

In FIG. 1, the pass switch 101, 102 is represented as a serial arrangement of a metal resistor 102 indicative of the pure resistive component $R_m$ of the pass switch (also referred to as the voltage independent resistance of the pass switch), and of an ideal switch 101 indicative of the on-resistance $R_{on}$ of the pass switch 101, 102 (also referred to as the voltage dependent resistance of the pass switch). The on-resistance $R_{on}$ is typically dependent on the voltage across the pass switch 101, 102, whereas the metal resistance $R_m$ is typically voltage independent.

The test system 100 comprises a pass current source 104 which is configured to provide or to control a pass current $I_p$ through the pass switch 101, 102, and a reference current source 114 which is configured to provide or to control a reference current $I_r$ through the serial arrangement of the reference switch 111 and the reference resistor 112. The current sources 104, 114 may be coupled to the switches 101, 111 via a pass pin 103 and a reference pin 113, respectively. The control current source 121 may be used to control the switching state of the pass switch 101, 102 and the reference switch 111.

The test system 100 comprises differential measurement means 122, 123, 124, 125 which are configured to measure a difference between the voltage drop at the pass pin 103 and the voltage drop at the reference pin 113. The voltage drop at the pass pin 103 is indicative of the voltage drop at the pass switch 101, 102 and the voltage drop at the reference pin 113 is indicative of the voltage drop at the reference switch 111 and the reference resistor 112. Subject to appropriate selection of the reference switch 111 and the reference resistor 112 (i.e. subject to calibration), the voltage drop at the reference pin 113 provides an indication of the current flowing through the pass switch 101, 102.

The differential measurement means 122, 123, 124, 125 may comprise a pre-amplifier 122, a buffer or gain stage 124 and a comparator 125, wherein the comparator 125 is configured to compare the voltage at one input of the comparator 125 with a reference voltage $V_{ref}$. The reference voltage $V_{ref}$ may be selected in dependence on the input voltage Vdd (also referred to as the supply voltage) of the pass switch 101, 102. The amplifiers may be considered to be ideal, e.g. by using chopper or auto zero type amplifiers. Furthermore, the differential measurement means 122, 123, 124, 125 may comprise an offset unit 123 configured to offset the (amplified) difference of the voltage drop at the pass pin 103 and the reference pin 113 by a pre-determined offset. The pre-determined offset may be selected independent of the metal resistance $R_m$.

The pass switch 101, 102 may be used within a switched mode power converter to control the charging and the discharging of an inductor, thereby transferring electrical energy from an input of the power converter to an output of the power converter. The power converter may comprise e.g. a boost converter, a buck converter or a buck-boost converter. The current flowing through the pass switch 101, 102 (i.e. an indication thereof) may be measured by arranging the reference resistor 112, the reference switch 111 and the reference current source 114 in parallel to the pass switch 101, 102 (as shown in FIG. 1). By doing this, the voltage drop at the reference pin 113 provides an indication of the current through the pass switch 101, 102.

Typically, the reference current through the reference switch 111 is significantly lower than the current through the pass switch 101, 102 (e.g. by a factor of 100 or more, or 1000 or more). This may be achieved by selecting the reference switch 111 and the reference resistor 112, such that the on-resistance of the reference switch 111 and the resistance of the reference resistor 112 is significantly higher (e.g. by a factor of 100 or more, or 1000 or more) than the metal resistance $R_m$ and the on-resistance $R_{on}$ of the pass switch 101, 102. By using relatively low reference currents, the losses incurred by the current measurement means may be reduced.

In order to ensure that the voltage drop at the reference pin 113 provides an accurate indication of the current through the pass switch 101, 102, the reference resistor 112 and the reference switch 111 should be calibrated with respect to the pass switch 101, 102. Such calibration is typically performed at pass currents which are significantly lower than the currents during normal operation of the pass switch 101, 102 within a power converter. Nevertheless, the calibration should ensure that the current measurement means 111, 112, 114 (i.e. the serial arrangement of reference resistor 112, reference switch 111 and reference current source 114) provide an accurate indication of the current through the pass switch 101, 102.

As indicated above, the pass switch 101, 102 comprises two resistive components, i.e. the metal resistance $R_m$ and the on-resistance $R_{on}$, which have a different behavior with respect to the input or supply voltage Vdd. The $R_{on}$ of the pass switch 101, 102 typically depends on the supply voltage Vdd and the temperature and $R_m$ typically only depends on the temperature (and not on the supply voltage Vdd). It is therefore proposed in the present document to provide current measurement means 111, 112, 114 which comprise a reference resistor 112 to match the metal resistance $R_m$ of the pass switch 101, 102, and which comprise a reference switch 111 to match the on-resistance $R_{on}$ of the pass switch 101, 102.

Figure 2A:
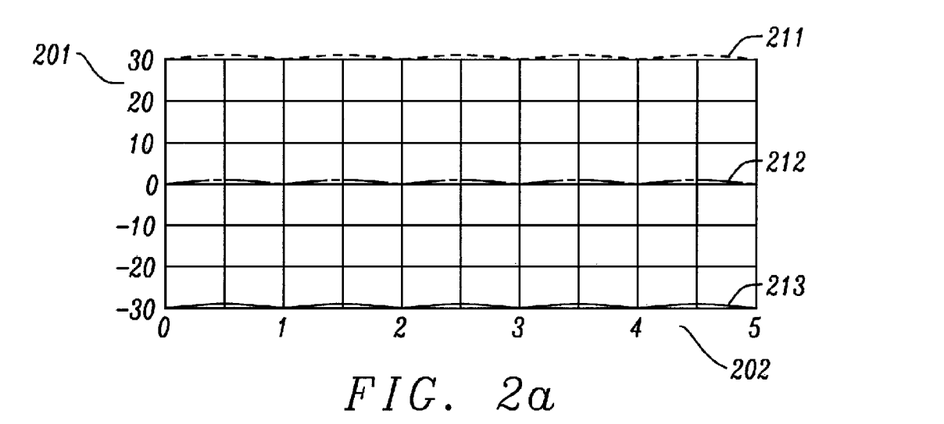
FIG. 2a shows an example experimental calibration result using voltage modulation.

An appropriate reference resistor 112 and an appropriate reference switch 111 may be selected in the context of a two step calibration method using the test system 100. In a first step, the on-resistance $R_{on}$ of the pass switch 101, 102 and of the reference switch 101 may be calibrated. For doing this, the supply voltage Vdd may be modulated. The modulation of the supply voltage Vdd will typically be visible at the output of the differential measurement means 122, 123, 124, 125 and may be used to select an appropriate reference switch 111 having an on-resistance $R_{on}$ which matches the on-resistance $R_{on}$ of the pass switch 101, 102. This is illustrated in FIG. 2a, wherein the differential voltage 201 at the output of the differential measurement means 122, 123, 124, 125 is illustrated over time 202 using different reference switches (graphs???? 211, 212, 213), having different on-resistances, respectively. The supply voltage Vdd may e.g. be modulated between 3V to 5V along the time line 202. When modulating the supply voltage Vdd, the pass current through the pass switch 101, 102 and the reference current through the reference switch 111 may be maintained constant, respectively. It can be seen that the different reference switches (having different on-resistances) may lead to an over- or under-compensation of the on-voltage (graphs??? 211, 213). In the illustrated example, only the reference switch which corresponds to the middle graph 212 provides an appropriate match of the on-resistance $R_{on}$ of the pass switch 101, 102. Consequently, this reference switch is selected as the reference switch 111 of the current measurement means.

Figure 2B:
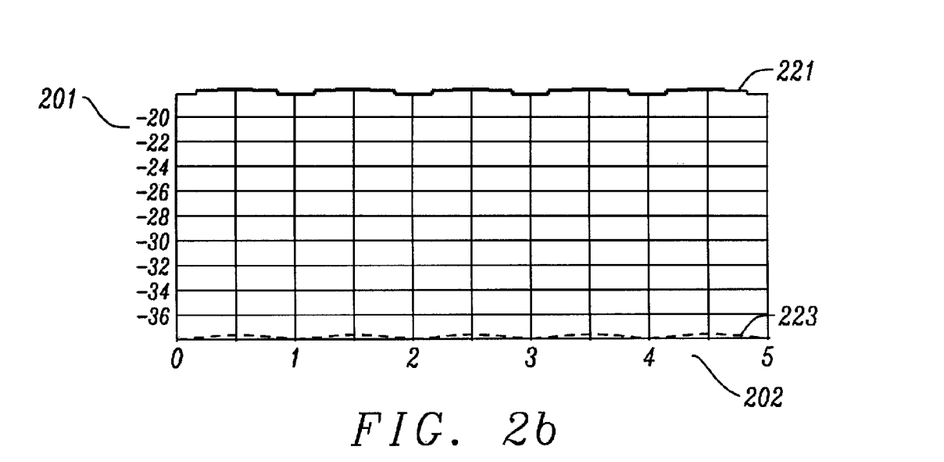
FIG. 2b shows an example experimental calibration result using current modulation.

After calibration of the on-resistance $R_{on}$ of the pass switch 101, 102 by selecting an appropriate reference switch 111, a current modulation (e.g. at constant supply voltage Vdd) may be used in a second step to calibrate the metal resistance $R_m$, by selecting an appropriate reference resistor 112. FIG. 2b shows the differential voltage 201 over time 202 for different currents (graphs 221, 223). Hence, by using at least two different currents through the reference resistor 112, the gain error due to the metal resistor can be measured and compensated (e.g. using the offset unit 123). This can be done in a bidirectional manner using the offset compensation of the OPAMP or in a unidirectional manner using a current source. This is due to the fact that the voltage range is typically small such that a current source can only pull but not sink into the node 113. On the other hand, an OPAMP typically allows for both directions of offset. In the illustrated example of FIG. 2b, the supply voltage Vdd is also modulated.

As a result of the two step approach, an appropriate reference switch 111 and an appropriate reference resistor 112 for the current measurement means may be selected.

In a further step, the reference current provided by the reference current source 114 may be calibrated. The voltage drop at the reference pin 113 typically depends on the reference current. In order to provide an accurate indication of the pass current at the reference pin 113, the reference current should take on a pre-determined value (which is e.g. 100 or 1000 times smaller than the pass current). This may be achieved by calibration of the reference current source 114.

Figure 3:
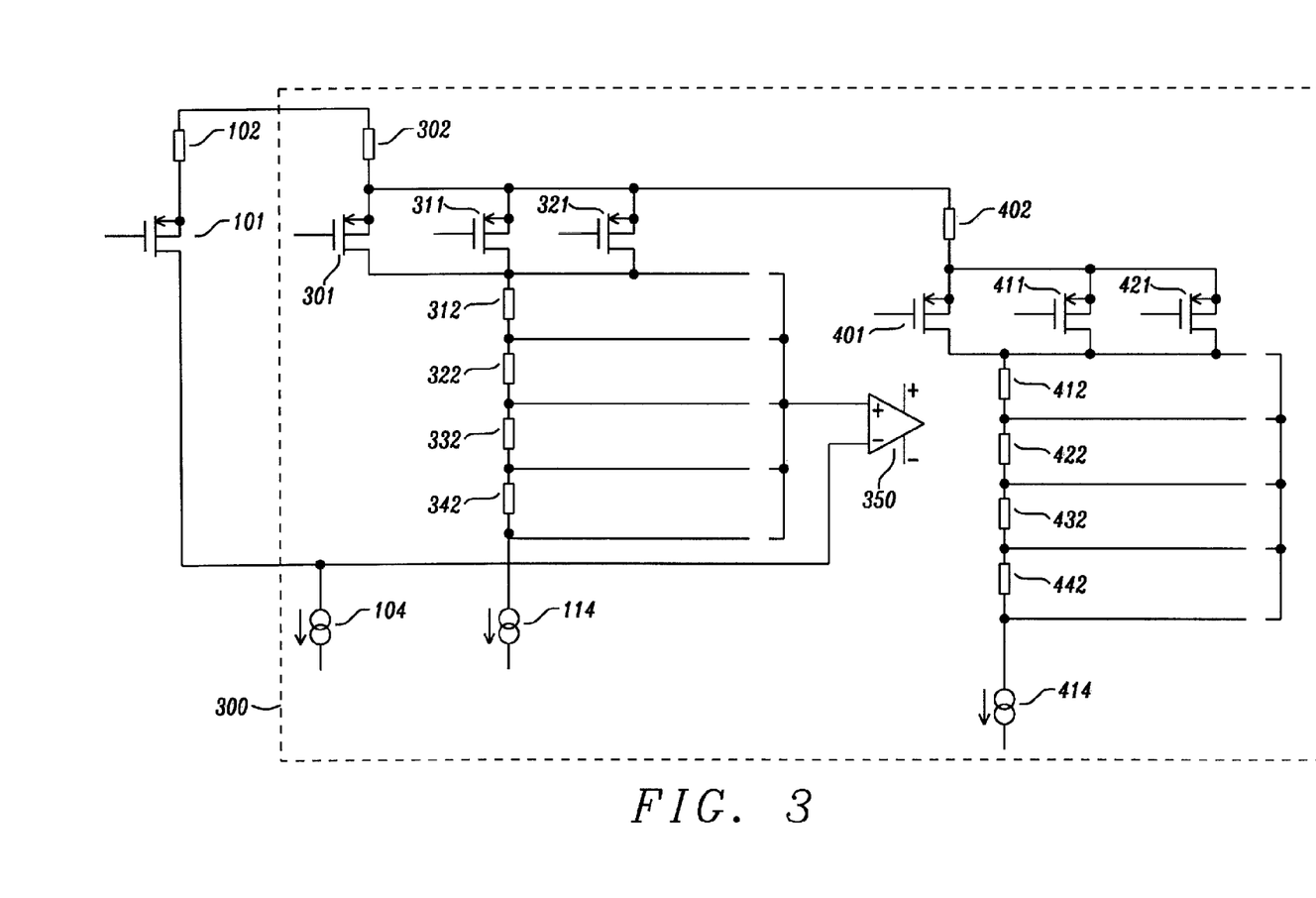
FIG. 3 shows a block diagram of example calibrated current measurement means.

FIG. 3 shows a block diagram of example current measurement means 300 as may be used in conjunction with the pass switch 101, 102 of a power converter, in order to provide an indication of the current flowing through the pass switch 101, 102. The indication of the current flowing through the pass switch 101, 102 may be provided at the comparator 350. The current measurement means 300 comprise at least one bank of serial reference resistors 312, 322, 332, 342 (referred to as the resistor bank) and at least one bank of parallel reference switches 301, 311, 321 (referred to as a switch bank). The serial arrangement of resistor bank and switch bank may be referred to as a matching unit. The matching unit may further comprise the reference current source 114.

Using the above mentioned calibration process, one of the reference switches 301, 311, 321 from the bank of reference switches may be selected, in order to match the on-resistance of the pass switch 101, 102. Furthermore, the bank of reference resistors 312, 322, 332, 342 and an optional pre-adjustment resistor 302 may be used to match the metal resistance of the pass switch 101, 102. This may be achieved by including more or less of the serial reference resistors from the bank of reference resistors to form an overall reference resistor. In particular, the overall reference resistor 112 may comprise the serial arrangement of the pre-adjustment resistor 302 and zero, one or more of the resistors from the bank of reference resistors 312, 322, 332, 342.

By doing this, the voltage dependent on-resistance and the voltage independent resistance of the current measurement means 300 may be closely matched to the on-resistance and the metal resistance of the pass switch 101, 102 (subject to a pre-determined scaling factor), thereby allowing for an accurate measurement of the current flowing through the pass switch 101, 102.

The current measurement means 300 may comprise one or more further matching units each comprising a bank of parallel reference switches 401, 411, 421, a bank of serial reference resistors 412, 422, 422, 432, 442 and a reference current source 414. Each of the matching units may be used in conjunction with a pre-adjustment resistor 402 which is arranged in series with the pre-adjustment resistor 302 of a previous matching unit. In particular, a matching unit may be coupled to the supply voltage via its own pre-adjustment resistor 402 and via the serial arrangement of the pre-adjustment resistors 302 of all preceding matching units. By doing this, the current measurement means 300 may be configured to match increasing values of the metal resistance of the pass switch 101, 102.

Figure 4:
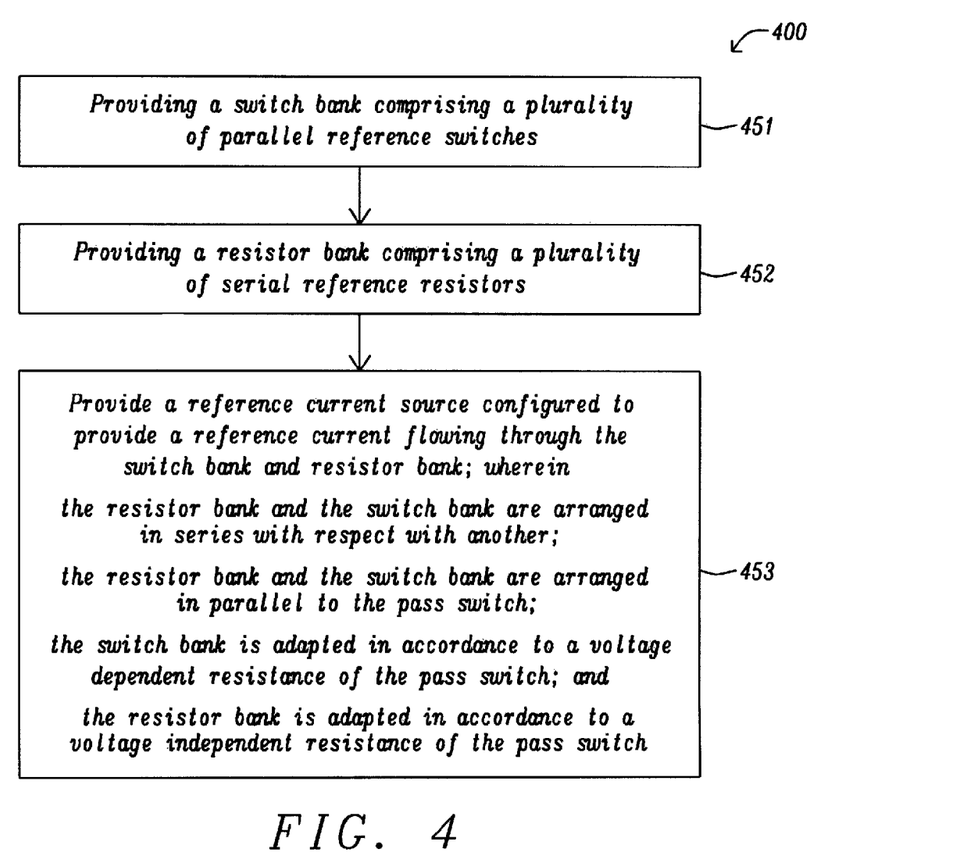
FIG. 4 shows a flow chart of an example method for providing an indication of the current flowing through a pass device.

FIG. 4 shows a flow chart of an example method 400 for providing an indication of a current flowing through a pass switch 101, 102. The method 400 comprises providing 451 a switch bank comprising a plurality of parallel reference switches 301, 311, 321. The method 400 further comprises providing 452 a resistor bank comprising a plurality of serial reference resistors 312, 322, 332, 342. In addition, the method comprises providing 453 a reference current source 114 configured to provide a reference current flowing through the switch bank and the resistor bank. The resistor bank and the switch bank may be arranged in series. Furthermore, the resistor bank and the switch bank may be arranged in parallel to the pass switch 101, 102. The switch bank may be adapted in accordance to a voltage dependent resistance of the pass switch 101, 102 and the resistor bank may be adapted in accordance to a voltage independent resistance of the pass switch 101, 102.

In the present document, current measurement means have been described which may be adjusted to provide an accurate indication of the current flowing through a pass switch. The current measurement means may be used e.g. in conjunction with a power converter comprising the pass switch, thereby enabling the control of the pass switch in dependence of the current flowing through the pass switch (e.g. in dependence of a pre-determined peak current flowing through the pass switch). The current measurement means can be placed between two pins of the power converter and all the parasitic elements between the two pins may be taken into account and may be matched, i.e. may be compensated. This allows for a robust measurement of the current flowing through the pass switch. It should be noted that in case of an adequate matching of the current measurement means to the pass switch, the current measurement means described herein provide an accurate indication of the current flowing through the pass switch, without the need for calibration.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A circuit arrangement configured to provide an indication of a current flowing through a pass switch, when the pass switch is arranged in parallel to the circuit arrangement, the circuit arrangement comprising a matching unit which comprises a switch bank comprising a plurality of parallel reference switches;

a resistor bank comprising a plurality of serial reference resistors; and a reference current source configured to provide a reference current flowing through the switch bank and the resistor bank;

wherein the resistor bank and the switch bank are arranged in series;

a total resistance of the pass switch is dividable into a voltage dependent component, referred to as a voltage dependent resistance of the pass switch, which depends on a voltage across the pass switch, and into a voltage independent component, referred to as a voltage independent resistance of the pass switch, which is independent of the voltage across the pass switch;

the switch bank is adapted to match the voltage dependent resistance of the pass switch;

the resistor bank is adapted to match the voltage independent resistance of the pass switch; and a voltage dependent resistance of a first reference switch of the switch bank approximates the voltage dependent resistance of the pass switch multiplied by a scaling factor for a plurality of different supply voltages across the pass switch.

2. The circuit arrangement of claim 1, wherein a total resistance of the pass switch multiplied by a scaling factor corresponds to a total resistance of the matching unit; and/or the scaling factor is 10, 100, 1000 or greater.

3. The circuit arrangement of claim 1, wherein a difference of a voltage dependent resistance of the first reference switch and the voltage dependent resistance of the pass switch multiplied by a scaling factor is smaller than or equal to a pre-determined voltage threshold for a plurality of different supply voltages.

4. The circuit arrangement of claim 3, wherein the difference obtained using the first reference switch is smaller than the difference obtained using another one of the plurality of reference switches of the switch bank.

5. The circuit arrangement of claim 1, wherein the indication of the current flowing through the pass switch is provided at an output of the resistor bank;

the output of the resistor bank corresponds to a point at a beginning, in-between or at an end of the plurality of serial reference resistors; and the point depends on the voltage independent resistance of the pass switch.

6. The circuit arrangement of claim 1, wherein the plurality of reference resistors of the resistor bank are voltage independent.

7. The circuit arrangement of claim 1, wherein the reference current provided by the reference current source corresponds to a current through the pass switch divided by a scaling factor.

8. The circuit arrangement of claim 1, wherein a total resistance of the resistor bank corresponds to the voltage independent resistance of the pass switch multiplied by a scaling factor.

9. The circuit arrangement of claim 1, wherein the circuit arrangement further comprises a pre-adjustment resistor arranged in series with the switch bank and the resistor bank;

the pre-adjustment resistor comprises a voltage independent resistor; and a total resistance of the resistor bank and the pre-adjustment resistor corresponds to the voltage independent resistance of the pass switch multiplied by a scaling factor.

10. The circuit arrangement of claim 9, wherein the circuit arrangement comprises an ordered series of matching units;

the circuit arrangement comprises an ordered series of pre-adjustment resistors for the ordered series of matching units, respectively;

a particular matching unit of the ordered series of matching units is coupled to a supply voltage via its corresponding pre-adjustment resistor and via the pre-adjustment resistor corresponding to the matching unit preceding the particular matching unit in the ordered series of matching units.

11. The circuit arrangement of claim 9, wherein the switch banks of the ordered series of matching units comprise corresponding pluralities of reference switches.

12. A system comprising a pass switch configured to commutated between an on-state and an off-state; and a circuit arrangement arranged in parallel to the pass switch configured to provide an indication of a current flowing through a pass switch, when the pass switch is arranged in parallel to the circuit arrangement, wherein the circuit arrangement comprises a matching unit which comprises a switch bank comprising a plurality of parallel reference switches;

a resistor bank comprising a plurality of serial reference resistors; and a reference current source configured to provide a reference current flowing through the switch bank and the resistor bank;

wherein the resistor bank and the switch bank are arranged in series;

a total resistance of the pass switch is dividable into a voltage dependent component, referred to as a voltage dependent resistance of the pass switch, which depends on a voltage across the pass switch, and into a voltage independent component, referred to as a voltage independent resistance of the pass switch, which is independent of the voltage across the pass switch;

the switch bank is adapted to match the voltage dependent resistance of the pass switch;

the resistor bank is adapted to match the voltage independent resistance of the pass switch; and a voltage dependent resistance of a first reference switch of the switch bank approximates the voltage dependent resistance of the pass switch multiplied by a scaling factor for a plurality of different supply voltages across the pass switch.

13. The system of claim 12, wherein a total resistance of the pass switch multiplied by a scaling factor corresponds to a total resistance of the matching unit; and/or the scaling factor is 10, 100, 1000 or greater.

14. The system of claim 12, wherein the switch bank comprises a first reference switch which is in an on-state, when the pass switch is in an on-state; and/or the others of the plurality of reference switches are in an off-state, when the pass switch is in an on-state.

15. The circuit arrangement of claim 12, wherein a difference of a voltage dependent resistance of the first reference switch and the voltage dependent resistance of the pass switch multiplied by a scaling factor is smaller than or equal to a pre-determined voltage threshold for a plurality of different supply voltages.

16. The system of claim 12, wherein a difference obtained using the first reference switch is smaller than the difference obtained using another one of the plurality of reference switches of the switch bank.

17. A method for providing an indication of a current flowing through a pass switch, the method comprising
- providing a switch bank comprising a plurality of parallel reference switches;
- providing a resistor bank comprising a plurality of serial reference resistors; and
- providing a reference current source configured to provide a reference current flowing through the switch bank and the resistor bank;

wherein
- the resistor bank and the switch bank are arranged in series with respect to one another;
- the resistor bank and the switch bank are arranged in parallel to the pass switch;
- a total resistance of the pass switch is dividable into a voltage dependent component, referred to as a voltage dependent resistance of the pass switch, which depends on a voltage across the pass switch, and into a voltage independent component, referred to as a voltage independent resistance of the pass switch, which is independent of the voltage across the pass switch;
- the switch bank is adapted to match the voltage dependent resistance of the pass switch;
- the resistor bank is adapted to match the voltage independent resistance of the pass switch; and
- a voltage dependent resistance of a first reference switch of the switch bank approximates the voltage dependent resistance of the pass switch multiplied by a scaling factor for a plurality of different supply voltages across the pass switch.

18. The method of claim 17, further comprising of the step:
- Multiplying by a scaling factor where a total resistance of the pass switch is multiplied by a scaling factor corresponds to a total resistance of the matching unit; and/or the scaling factor is 10, 100, 1000 or greater.

19. The method of claim 17, wherein
the switch bank comprises a first reference switch which is in an on-state, when the pass switch is in an on-state; and/or
the others of the plurality of reference switches are in an off-state, when the pass switch is in an on-state.

* * * * *